United States Patent [19]

McClurg

[11] Patent Number: 4,997,793

[45] Date of Patent: Mar. 5, 1991

[54] METHOD OF IMPROVING CLEAVING OF DIODE ARRAYS

[75] Inventor: Scott D. McClurg, Rochester, N.Y.

[73] Assignee: Eastman Kodak Company, Rochester, N.Y.

[21] Appl. No.: 439,920

[22] Filed: Nov. 21, 1989

[51] Int. Cl.$^5$ .................. H01L 21/302; H01L 21/304
[52] U.S. Cl. ..................................... 437/226; 437/225; 437/227; 437/905; 156/662; 156/644; 156/645; 148/DIG. 168; 148/33.2; 225/2
[58] Field of Search .............. 437/225, 226, 227, 905; 225/2; 156/644, 662, 645, 647

[56] References Cited

U.S. PATENT DOCUMENTS

| 4,217,689 | 8/1980 | Fujii et al. | 437/227 |
|---|---|---|---|
| 4,236,696 | 12/1980 | Woolhouse et al. | 29/569 L |
| 4,237,601 | 12/1980 | Woolhouse et al. | 437/226 |
| 4,355,457 | 10/1982 | Barlett et al. | 156/645 |
| 4,604,161 | 8/1986 | Araghi | 156/645 |
| 4,605,944 | 8/1986 | Ishii et al. | 357/17 |
| 4,610,079 | 9/1986 | Abe et al. | 437/227 |
| 4,668,333 | 5/1987 | Tandon et al. | 156/647 |
| 4,729,971 | 3/1988 | Coleman | 437/226 |
| 4,810,557 | 3/1989 | Blonder | 156/647 |
| 4,814,296 | 3/1989 | Jedlicka et al. | 437/226 |
| 4,822,755 | 4/1989 | Hawkins et al. | 437/226 |
| 4,878,992 | 11/1989 | Campanelli | 156/645 |
| 4,900,283 | 2/1990 | Fukae | 437/226 |

FOREIGN PATENT DOCUMENTS

| 0072055 | 5/1980 | Japan | 437/226 |
|---|---|---|---|
| 0154639 | 8/1985 | Japan | 437/226 |
| 0092026 | 4/1988 | Japan | 437/226 |

OTHER PUBLICATIONS

Suss RA 12a0 M Suss RA 120 Automatic Scribers, p. 3.

Primary Examiner—Brian E. Hearn
Assistant Examiner—Trung Dang
Attorney, Agent, or Firm—Norman Rushefsky

[57] ABSTRACT

A relatively wide scribing channel is provided between the ends of each adjacent pair of diode array areas on a wafer to expose the epitaxial layer of the wafer. A scribing groove is then scribed in the scribing channel to define a cleavage line along which the array areas are separated.

8 Claims, 2 Drawing Sheets

METHOD OF IMPROVING CLEAVING OF DIODE ARRAYS

CROSS-REFERENCE TO A RELATED APPLICATION

Reference is made to commonly assigned copending patent application Ser. No. 07/439,919, filed simultaneously herewith in the name of Scott Douglas McClurg and entitled Separation of Diode Array Chips During Fabrication Thereof.

BACKGROUND OF THE INVENTION

1. Field of the Invention

The present invention relates to diode arrays and, more particularly, to means for facilitating scribing of a light-emitting diode LED array fabrication wafer to separate individual array chips.

2. Description Relative to the Prior Art

LED arrays are well known in the prior art and are typically used in printheads for electrophotographic copiers or the like. Such a printhead array comprises a row of uniformly spaced LED light sources that can be individually energized to expose a photoreceptor or other image-receiving medium to produce an image pattern. A typical LED printhead array of this type for standard DIN A4 paper dimensions would be about 216 millimeters long and the individual light sources are very small and very closely spaced, e.g., as many as 600 or more sites per linear inch, which makes it impossible at the present state of the art to provide a full length LED array in one piece. Accordingly, the complete printhead array comprises a number of individual array chips, each being typically less than 10 millimeters long, which are mounted in end-wise relation to one another to provide the full length printhead array.

A typical basic process for providing such LED array chips, greatly simplified for purposes of explanation, uses a substrate wafer comprising a layer of gallium arsenide, supporting one or more epitaxial layers of gallium arsenide phosphide. A diffusion barrier layer of silicon nitride or some other glass-like material is then coated over the epitaxial layer and photolithographic techniques are used to produce a patterned photoresist on this layer so that an etching procedure can be employed to etch diode site openings through the barrier diffusion barrier material, whereupon the photoresist material is completely removed A dopant material, such as zinc, is then diffused into the gallium arsenide phosphide epitaxial layer using conventional semiconductor diffusion processes, with the silicon nitride layer acting as a barrier to protect other regions of the epitaxial layer. A silicon dioxide barrier layer is provided at the back side of the wafer during the high temperature diffusion process. By providing excess holes in the doped epitaxial regions, the doping process defines each light emitting site as a p-n junction in which the doped site is positive and the surrounding epitaxial material is negative by virtue of its inclusion of a trace material such as tellurium, which is added to the epitaxial layer in the process of producing the initial wafer with its epitaxial layer or layers. After the dopant procedure has been completed, the silicon dioxide barrier layer is removed and the wafer is then again covered with a photoresist pattern to define electrode regions. A metal, typically aluminum, is then evaporated onto the wafer and a subsequent treatment causes the photoresist to swell and to lift the metal off the wafer except in the areas in which electrodes are desired. Finally, the entire wafer surface is coated with a hard anti-reflection coating, of silicon nitride or the like, to protect the chip and enhance the light output of the array chips. The reverse side of the wafer is then lapped to achieve controlled constant thickness of the wafer material (approximately 350 microns) and an ohmic contact material, typically comprising several layers of gold and other metals, is applied to the lower face of the wafer and the wafer is then heated to improve the ohmic contact on the lower wafer face. A photoresist material is then again applied to the upper or diode face of the wafer by photolithographic means and the anti-reflective coating is etched away down to the electrode metal to define bond pad regions by which the diode array chip is connected to appropriate electronic energizing means.

Various methods can be employed for separating the individual array chips on the wafer, including sawing and scribing the wafer and then cleaving it along the scribe lines. This procedure can be employed either by scribing the top or the bottom surface of the wafer, but the present invention relates to the method employing scribing the top surface which, particularly when used in conjunction with the present invention, reduces the danger of damaging the very critical face of the wafer that actually defines the light-emitting sites.

To effect proper cleavage of the wafer, it is necessary that the scribing tool, typically a diamond scribing point generally in the shape of an inverted trapezoid or pyramid, penetrate into the epitaxial layer of the substrate material. If this is accomplished simply by penetrating the scribing tool through the layers of the wafer overlying the epitaxial layer, there is danger of chipping the anti-reflective coating or the diffusion barrier coating and thereby damaging the endmost light-emitting site immediately adjacent the scribe line, which must be very close to the endmost diode-emitting site in order that the arrays may be abutted end-to-end with all of the light-emitting sites equally spaced throughout the length of the assembled printhead array. Also, because the anti-reflective coating material and the barrier layer material, typically silicon nitride, are very hard, penetrating through that material imposes additional wear on the diamond scribing tool and dictates substantially higher scribing pressure than is necessary if the scribing tool engages only the substantially softer gallium arsenide or gallium arsenide phosphide material. Accordingly, it has previously been suggested that very narrow, straight scribing channels, sometimes referred to as paths or streets, be provided through the overlying materials of the wafer to expose the gallium arsenide substrate or at least the epitaxial layer of the wafer to the scribing tool. As implied by the term "streets", such channels are straight and of uniform width, and are formed during the preceding fabrication procedure by using the above-described photolithographic and etching techniques at appropriate stages to expose the wafer material in those regions defining such channels or paths. However, because of the very close spacing required between the endmost LED site on each array and the corresponding end of the array chip, which limits the maximum width of the scribing channel between adjacent diode sites, the tapered shape of the scribing tool makes it very difficult to scribe a cleavage groove of an effective depth without contacting the material along the edge of the scribing channel, which poses a significant risk of chipping off or cracking that material and thereby damaging the adjacent diode site.

SUMMARY OF THE INVENTION

In accordance with the present invention, the foregoing problems are solved by using a variation of a technique known as interval or skip-scribing, in which the cleavage line of the wafer is determined by a scribe line or groove that, rather than being continuous, is interrupted between the corresponding diode sites. In other words, as the scribing tool moves across the wafer, it is periodically raised and lowered to produce an intermittent cleavage groove. By avoiding scribing between the diode sites, this approach eliminates the danger of damaging those sites during the scribing operation, but if the width of the scribing channel is dictated by the diode site spacing, the scribing tool is still likely to encounter the edges of the channel. Because the depth of the groove scribed in the wafer material is controlled by the pressure on the scribing tool, any such interference with an edge of the channel will influence the depth of the scribed groove and will also tend to deflect the scribing tool laterally. Accordingly, the present invention overcomes this problem by providing a cleavage channel that comprises a narrow connecting channel between two wider scribing channels. The narrow connecting channel prevents the fracturing of the wafer from damaging the overlying chip layers and thereby possibly damaging the adjacent diode sites. The wider scribing channels provide clearance for the scribing tool but the additional width of these channels does not threaten the adjacent diode sites. On the separated chips, therefore, only a very narrow strip of wafer material is exposed in the cleavage channel area between the endmost diode site and the cleaved wafer edge, whereas a wider region of wafer material is exposed in the scribing street areas along the cleaved edge of the chip at either side of the endmost diode site.

Various means for practicing the invention and other advantages and novel features thereof will be apparent from the following description of illustrative preferred embodiments of the invention, reference being made to the accompanying drawings.

DESCRIPTION OF THE ILLUSTRATIVE PREFERRED EMBODIMENTS

Figure 1:
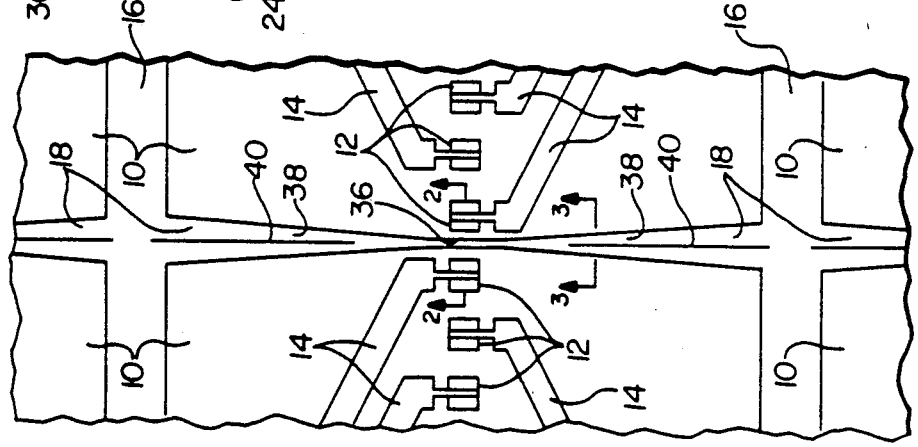
FIG. 1 is a greatly enlarged plan view of a portion of a fabrication wafer in accordance with a preferred embodiment of the present invention, showing the ends of adjacent LED array chip areas separated by a cleavage channel and by an interrupted scribe line.

FIG. 1 illustrates, greatly enlarged, a portion of an LED fabrication wafer showing the confronting ends of two LED array areas 10, each of which includes a central row of LED sites 12 and the corresponding electrodes 14. The individual rectangular array areas, which are later separated into discrete LED array chips, are located on the wafer in rows and columns defined, respectively, by horizontally illustrated streets or channels 16 for use in sawing and by vertically depicted streets or scribing channels 18 for use in scribing and the cleaving.

Figure 2:
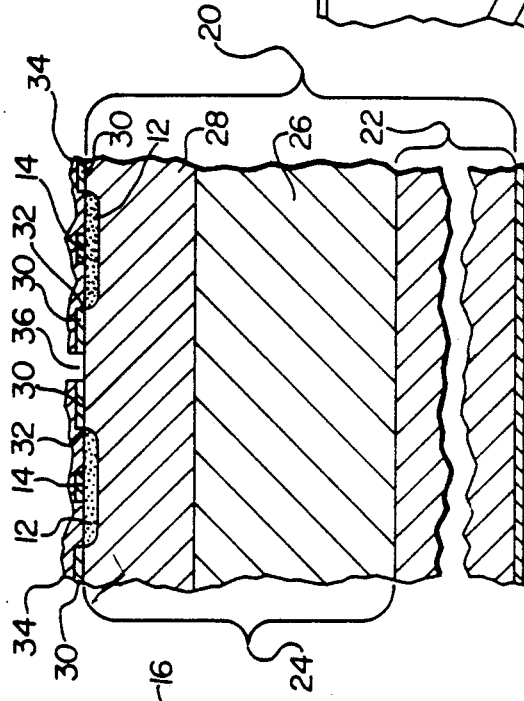
FIG. 2 is a further enlarged cross sectional view taken along line 2—2 of FIG. 1 showing the various layers of the array chip and the portion of the scribing channel portion of the cleavage channel located between the endmost diode sites of the two depicted array chip areas.

FIG. 2 illustrates a typical LED array chip comprising a support wafer 20 having a gallium arsenide substrate 22 and an epitaxial layer 24 which, in turn, comprises a graded epitaxial sub-layer 26 and a constant epitaxial sub-layer 28. In the graded sub-layer 26, the concentration of phosphorus increases toward the constant sub-layer 28, which has a constant phosphorus content approximately equal to that in the adjacent region of the graded epitaxial layer; the purpose of this double sub-layer structure being to provide a gradual transition between the different coefficients of thermal expansion of the gallium arsenide substrate material and the gallium arsenide phosphide material of the constant epitaxial sub-layer 28. The epitaxial layer is also previously treated to include a dopant material such as tellurium, which provides the required electrical characteristics to create a junction with the region in which dopant material is later diffused into the epitaxial layer to define the individual LED sites.

As previously described, a patterned layer of diffusion barrier material 30, such as silicon nitride, is deposited on the epitaxial face of the support wafer to define openings 32 through which a dopant material such as zinc is diffused into the constant epitaxial layer 28 to define the LED sites 12, and electrodes 14 are formed to allow the individual LED sites to be connected to external circuitry, not shown. A layer 34 of anti-reflective material such as silicon nitride is then coated over the light-emitting face of the array. A multiple layer coating of metal is applied to the opposite wafer face to provide an ohmic contact surface 35 and openings are then etched through the anti-reflective layer to expose bond pad regions of the electrodes. The same processes used to provide the openings in the diffusion barrier layer and to remove the anti-reflective coating from the bonding pad regions are also employed to define sawing channels 16 and scribing channels 18, along which the epitaxial layer is accessible. If necessary, similar channels can also be provided in the metal coating on the back face of the wafer, opposite the scribing channels to avoid tearing the metal coating during the cleavage operation.

The well-known technique of processing a large semiconductor wafer and singulating it into many individual LED array chips can involve many different techniques and variations in the chip construction and, accordingly, the specific construction described above and illustrated in FIG. 2 should be considered as illustrative only.

Referring again to FIG. 1, the illustrated scribing channel 18 includes a narrow central connecting channel 36 between the two adjacent endmost LED sites of the corresponding array areas A scribing channel 38, substantially wider than connecting channel 36, tapers outwardly from each end of the connecting channel toward the corresponding sawing streets along scribed grooves 40.

Figure 3:
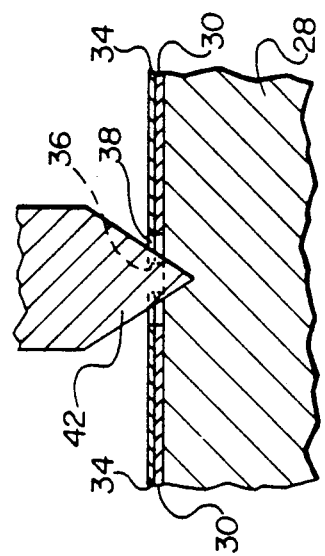
FIG. 3 is a cross sectional view corresponding to a further enlarged portion of FIG. 2 but taken along line 3—3 of FIG. 1, showing a scribing tool located along the scribing channel portion of the cleavage channel.

In FIG. 3, the conventional diamond pointed scribing tool 42 is shown in the process of scribing groove 40 along the scribing channel 38 near the innermost end of groove 40, i.e., near the narrowest part of the tapered scribing channel 38 adjacent the groove 40. Machines for scribing such intermittent grooves in semiconductors are well known in the art and are commercially available. By comparing FIGS. 2 and 3, which are drawn to the same scale, it will be seen that the scribing tool has adequate clearance from the edges of channel 38 at the narrowest part of the channel encountered by the tool, but that the tool could not scribe the epitaxial layer to the same depth in the narrow channel 36 without destroying the edges of that channel. Similarly, the narrowest portions of the scribing channel adjacent the cleavage grooves could not be extended at the same width between the endmost LED sites without damaging those sites.

After all of the scribing channels have been scribed as depicted in FIG. 1, the wafer is separated into rows by sawing through the wafer along saw streets or channels 16 and each of the resulting rows is then separated into separate diode array chips by cleaving the rows along cleavage lines colinear with the scribed cleavage grooves 40.

The support wafer material inherently has a preferential cleavage plane with which the scribing channels are aligned during the process of orienting the photolithographic masks with the wafer, thereby abetting the subsequent cleavage of the wafer along the desired cleavage lines colinear with the cleavage grooves. The cleavage, therefore, extends along the center of the narrow connecting channel 36 so that the chip layers 30 and 34 are not fractured in the cleaving process, which might damage the adjacent diode array sites. If fracturing the top layers of the chip during the cleavage operation is acceptable, the connecting channel can simply be omitted. Various machines are commercially available for cleaving the wafer material, which may be adhered to an adhesive backing sheet during the cleavage operation so that the resulting individual chips are retained together for convenient handling.

Figure 4:
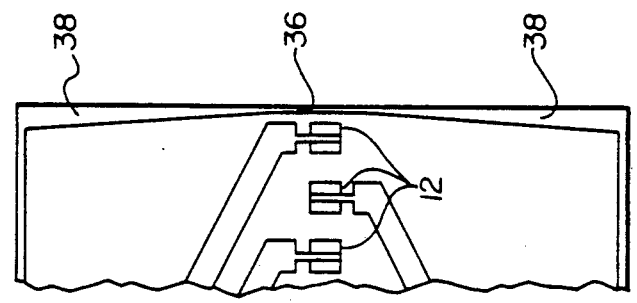
FIG. 4 is a plan view of the end portion of an LED array chip separated from the fabrication wafer shown in FIG. 1.

After the array areas are thus separated, portions of the scribing channels 36 and 38 are located at the end of each array chip, as shown in FIG. 4.

Figures 5, 6:
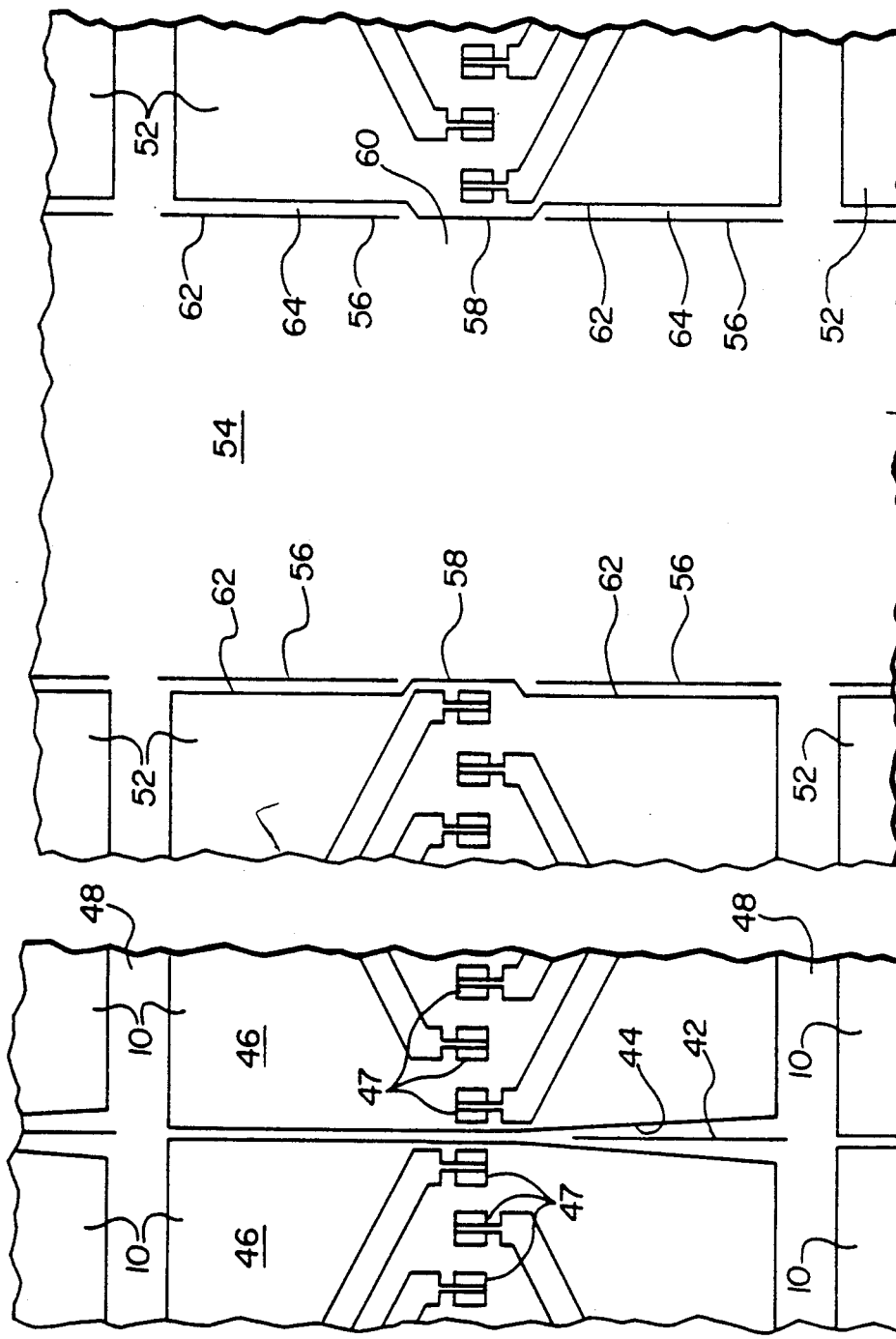
FIG. 5 corresponds to FIG. 1 but shows an alternate scribing pattern.
FIG. 6 is a view corresponding to FIG. 1 showing a fabrication wafer according to an alternate preferred embodiment of the invention on which adjacent LED array chip areas are separated by a wide cleavage channel having a different profile and scribed with two parallel interrupted scribe grooves.

FIG. 5 is generally similar to FIG. 1 but shows a wafer embodiment wherein only one scribed cleavage groove 42, along corresponding widened scribing channel 44 is provided between the confronting ends of each adjacent pair of array areas 46 at only one side of the diode sites 47. This embodiment illustrates that, because the wafer tends to cleave along a straight line beyond the cleavage groove, it is not essential to employ two centrally spaced colinear scribed grooves between each pair of array areas if only one such groove originating in the corresponding sawing channel 48, is sufficient to provide proper cleavage.

In the embodiment of the invention shown in FIG. 6, the scribing channel 50 between the columns of array areas 52 is much wider than the previously described channel 18 in order that the adjacent array areas can be separated by removing the strip or bar portion of wafer material 54 between two interrupted lines of cleavage grooves 56 along opposite edges of wafer portion 54. This wafer separating technique is disclosed in greater detail in my previously-referenced commonly assigned copending U.S. patent application Ser. No. 439,919.

Although the scribing channel 50 is very wide relative to the width of the scribing tool, scribing the wafer nevertheless involves the same problem previously discussed, because each cleavage line must be spaced from the endmost diode site by slightly less, but in no event, more than half the distance between the adjacent diode sites, to allow the array chips to be mounted end-to-end with all of the diode sites in the array assemblage uniformly spaced. Rather than being uniformly tapered outwardly from the edges 58 of the central connecting channel 60 adjacent the endmost diode sites, the edges of the scribing channels 64 at opposite ends of the connecting channel 62 are parallel to the location of the scribed cleavage grooves 56. This difference from the previously discussed embodiment illustrates that the particular profile of the scribing channel edges is not critical, the essential consideration being that adequate clearance is provided to prevent the scribing tool from encountering an edge of the scribing channel in the process of scribing a cleavage groove and that an edge of the scribing channel along its widened portion adjacent the groove does not extend far enough toward the corresponding diode site to endanger that site.

Although the invention has been described in the context of producing LED array chips, it is equally applicable to diode array chips wherein the diode sites are light-detecting sites rather than light-emitting sites.

The invention has been described with reference to illustrative preferred embodiments but variations and modifications are possible within the spirit and scope of the invention as defined by the following claims.

What is claimed is:

1. A method for separating individual diode arrays formed on a wafer having a plurality of rectangular diode array areas each of which includes a central row of uniformly spaced diode sites extending between its opposite ends, said areas being arranged on said wafer in multiple rows and columns, said wafer comprising a substrate provided with an epitaxial layer including said diode sites and with at least one additional layer overlying said epitaxial layer, said method comprising:

providing said wafer with scribing channels exposing said epitaxial layer through said additional layer along cleavage lines separating said columns of array areas between the confronting ends of adjacent array areas, each of said cleavage lines being spaced from an endmost diode site of an adjacent diode area by a distance no greater than half the distance between diode sites along said row, each of said scribing channels extending from one edge of a row of array areas toward the center of said array areas but terminating short of said diode sites, said channels being of a width which, if extended to said diode sites, would encroach on the endmost ones thereof;

scribing a cleavage groove along a cleavage line within a corresponding scribing channel between the confronting ends of adjacent pairs of diode array areas, said groove terminating short of the corresponding diode sites; and separating said adjacent array areas at opposite sides of said grooves fracturing said wafer along the corresponding cleavage line.

2. The method according to claim 1 including the step of separating adjacent array areas between adjacent rows thereof.

3. The method according to claim 2 in which said adjacent array areas are separated between adjacent rows thereof by sawing said wafer along lines separating said rows of array areas.

4. The method according to claim 2 in which said adjacent array areas are separated between adjacent rows thereof by scribing and cleaving said wafer along lines separating said rows of area arrays.

5. The method according to claim 1 in which said scribing channels are of uniform width throughout substantially their entire length.

6. The method according to claim 1 in which the width of each of said scribing channels tapers inwardly toward said diode sites.

7. The method according to claim 1 in which said scribing channels are joined by a connecting channel extending between the endmost diode sites of the adjacent array areas, said connecting channel being substantially narrower than the widest portion of said scribing channels.

8. The method according to claim 1 in which two colinear centrally spaced cleavage grooves are scribed along said cleavage line within corresponding scribing channels between the confronting ends of pairs of diode array areas.

* * * * *